United States Patent
Miyazaki

(10) Patent No.: US 10,503,079 B2
(45) Date of Patent: Dec. 10, 2019

(54) POSITION DETECTION METHOD, POSITION DETECTION APPARATUS, LITHOGRAPHY APPARATUS, AND ARTICLE MANUFACTURING METHOD

(71) Applicant: CANON KABUSHIKI KAISHA, Tokyo (JP)

(72) Inventor: Tadaki Miyazaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 142 days.

(21) Appl. No.: 15/689,051

(22) Filed: Aug. 29, 2017

(65) Prior Publication Data
US 2018/0059553 A1    Mar. 1, 2018

(30) Foreign Application Priority Data

Aug. 31, 2016 (JP) .................................. 2016-170066

(51) Int. Cl.
G03F 7/20 (2006.01)
G03F 1/84 (2012.01)
G03F 9/00 (2006.01)

(52) U.S. Cl.
CPC ............ *G03F 7/70666* (2013.01); *G03F 1/84* (2013.01); *G03F 7/7065* (2013.01); *G03F 7/70258* (2013.01); *G03F 9/7003* (2013.01)

(58) Field of Classification Search
None
See application file for complete search history.

(56) References Cited

U.S. PATENT DOCUMENTS 7,746,446 B2 * 6/2010 Okita ..................... G03F 9/7092
355/53
8,279,409 B1 * 10/2012 Sezginer ................... G03F 1/70
355/67

(Continued)

FOREIGN PATENT DOCUMENTS

JP        H04098377 A    3/1992

OTHER PUBLICATIONS

Ding et al, High Performance Lithography Hotspot Detection with Successively Refined Pattern Identifications and Machine Learning, IEEE Transactions on Computer-Aided Design of Integrated Circuits and Systems, vol. 30, No. 11, Nov. 2011 1621 (Year: 2011).*

(Continued)

*Primary Examiner* — Andrae S Allison
(74) *Attorney, Agent, or Firm* — Rossi, Kimms & McDowell LLP

(57) ABSTRACT

A method detects a position of a target in an image using a template having first to Nth feature points. The method includes obtaining an index indicating correlation between the template and the image by repeating processing for each relative positions of the template with respect to the image, while sequentially setting first to nth (n≤N) feature points as a feature point of interest. When the feature point of interest is a Jth feature point, whether an intermediate index indicating the correlation obtained based on processing of the first to Jth feature points satisfies a censoring condition is determined, and processing of (J+1)th and subsequent feature points is canceled if the intermediate index satisfies the censoring condition.

17 Claims, 13 Drawing Sheets

(56) References Cited

U.S. PATENT DOCUMENTS

| | | | | |
|---|---|---|---|---|
| 2003/0202182 A1* | 10/2003 | Matsumoto | ......... | G03F 7/70633 |
| | | | | 356/401 |
| 2003/0204348 A1* | 10/2003 | Suzuki | ............. | G05B 19/41875 |
| | | | | 702/83 |
| 2004/0058540 A1* | 3/2004 | Matsumoto | ........... | G03F 9/7076 |
| | | | | 438/689 |
| 2004/0223157 A1* | 11/2004 | Nakajima | ............. | G03F 9/7088 |
| | | | | 356/401 |
| 2004/0257573 A1* | 12/2004 | Matsumoto | ........... | G03F 9/7046 |
| | | | | 356/401 |
| 2005/0254030 A1* | 11/2005 | Tolsma | ................... | G03B 27/42 |
| | | | | 355/53 |
| 2008/0193029 A1* | 8/2008 | Kamata | ................ | G06K 9/4604 |
| | | | | 382/249 |
| 2009/0297037 A1* | 12/2009 | Pele | ....................... | G06K 9/468 |
| | | | | 382/209 |
| 2012/0224051 A1* | 9/2012 | Yamane | .................... | G03F 1/84 |
| | | | | 348/131 |
| 2019/0064679 A1* | 2/2019 | Egashira | ............... | G03F 9/7073 |

OTHER PUBLICATIONS

Jia et al, Pixelated source mask optimization for process robustness in optical lithography, Sep. 26, 2011 / vol. 19, No. 20 / Optics Express 19384 (Year: 2011).*

Barnea et al., "A Class of Algorithms for Fast Digital Image Registration." IEEE Transactions on Computers. Feb. 1972:179-186. vol. C-21, No. 2.

* cited by examiner

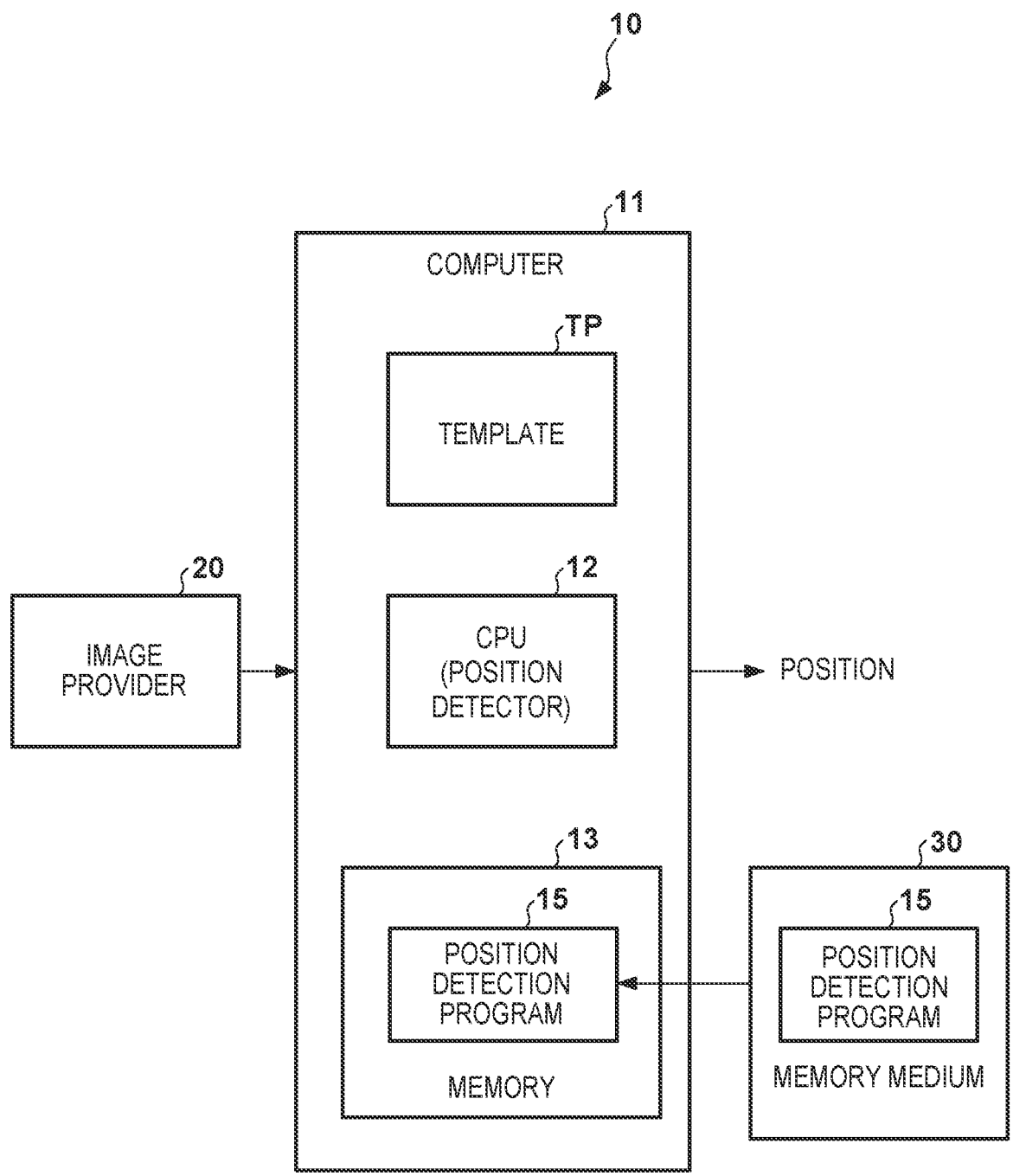

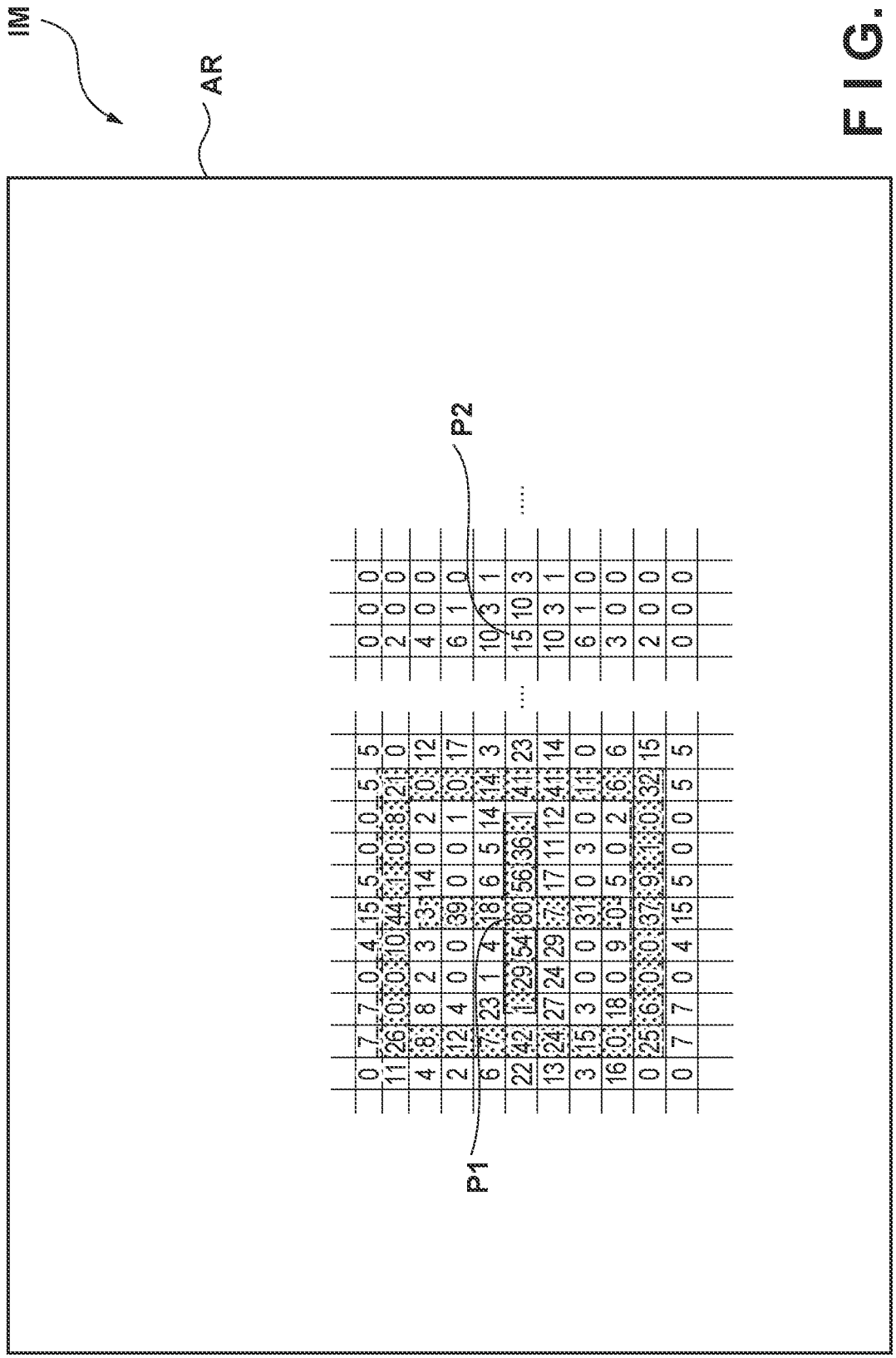

POSITION DETECTION METHOD, POSITION DETECTION APPARATUS, LITHOGRAPHY APPARATUS, AND ARTICLE MANUFACTURING METHOD

BACKGROUND OF THE INVENTION

Field of the Invention

The present invention relates to a position detection method, position detection apparatus, lithography apparatus, and article manufacturing method.

Description of the Related Art

Recently, as the degrees of micropatterning and integration of articles such as semiconductor devices increase, demands for improving the alignment accuracy of lithography apparatuses such as an exposure apparatus and imprint apparatus are becoming more severe. To detect the position of a substrate transferred to a lithography apparatus by a transfer mechanism, the lithography apparatus can detect the position of a detection target (mark) formed on the substrate. A method called template matching can be used in this detection of the position of the detection target. Template matching is a method of calculating an index indicating the correlation between an image containing a detection target and a template at each of a plurality of relative positions of the image and template while changing the relative positions, and detecting the position of the detection target based on a relative position having the highest correlation. In this specification, a high correlation means that a detection target in an image and a template match with high accuracy.

Examples of the index indicating the correlation are an SSD (Sum of Squared Difference) for obtaining the sum of squares of the difference between a temperature and an image, and an SAD (Sum of Absolute Difference) for obtaining the sum of absolute values of the difference. A normalized correlation (to be described later) is also the index indicating the correlation. Since it takes a long time to calculate the index indicating the correlation, various methods have been proposed in order to increase the calculation speed. For example, to increase the speed of the SSD or SAD, a method called an SSDA (Sequential Similarity Detection Algorithm) is available (D. I. Barnea, and H. F. Silverman, "A class of algorithms for fast digital image registration", IEEE Trans. On Computers, IEEE, February 1972, Vol. C-21, No. 2, pp. 179-186). In the SSDA, if an accumulated value exceeds a threshold during the calculation of dissimilarity in a given relative position, accumulation at subsequent feature points is canceled. The dissimilarity means that the smaller the value, the higher the correlation. Japanese Patent Laid-Open No. 4-098377 describes a method using the SSDA. In this method described in Japanese Patent Laid-Open No. 4-098377, if an accumulated value during a calculation exceeds an already calculated accumulated value in a search image, the calculation is canceled, and the process advances to processing in the next position. This obviates the need to perform any unnecessary calculations, and makes it possible to largely shorten the calculation time and increase the template matching rate.

Unfortunately, this conventional method poses the problem that it takes a long time to determine whether to cancel the calculation at each feature point. Especially when evaluating the correlation by the normalized correlation, determination requires a long time because the amount of calculations for obtaining a correlation degree is larger than those of the SSD and SAD.

SUMMARY OF THE INVENTION

The present invention provides a technique advantageous in respect of the time for detecting the position of a target.

One of aspects of the present invention provides a position detection method of causing a computer to detect a position of a target in an image by template matching using a template having first to Nth (N is a natural number not less than 3) feature points, the method comprising obtaining an index indicating correlation between the template and the image by repeating processing for each of a plurality of relative positions of the template with respect to the image, while sequentially setting first to nth (n N) feature points as a feature point of interest, wherein in the obtaining for each of the plurality of relative positions, in a case where the feature point of interest is a Jth (J is a natural number not less than 2 and less than N) feature point, whether an intermediate index indicating the correlation obtained based on processing of the first to Jth feature points satisfies a censoring condition is determined, and processing of (J+1)th and subsequent feature points is canceled in a case where the intermediate index satisfies the censoring condition.

Further features of the present invention will become apparent from the following description of exemplary embodiments with reference to the attached drawings.

BRIEF DESCRIPTION OF THE DRAWINGS

FIG. 1 is a view showing the arrangement of a position detection apparatus of one embodiment of the present invention;

FIG. 3A is a view for explaining a correlation degree;

DESCRIPTION OF THE EMBODIMENTS

Figure 2A:
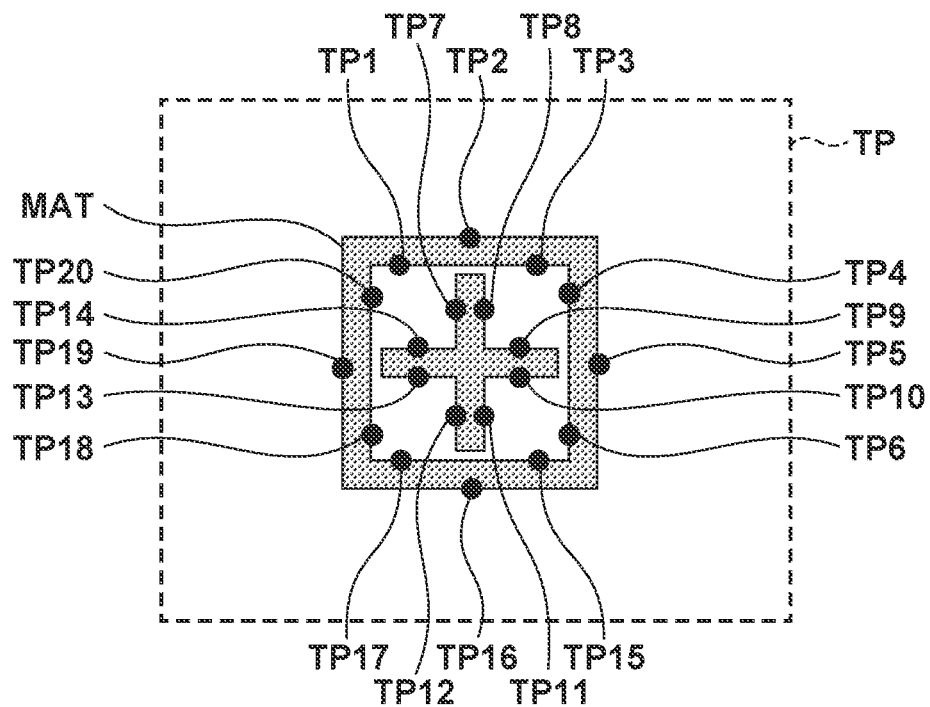
FIG. 2A is an exemplary view showing a template according to the embodiment of the present invention.

The present invention will be explained below by way of its exemplary embodiments with reference to the accompanying drawings.

FIG. 1 shows the arrangement of a position detection apparatus 10 of an embodiment of the present invention. The position detection apparatus 10 shown in FIG. 1 can be formed by, for example, installing a position detection program 15 in a computer 11. The position detection apparatus 10 may also be formed by a PLD (Programmable Logic Device) such as an FPGA (Field Programmable Gate Array), or an ASIC (Application Specific Integrated Circuit).

In this example shown in FIG. 1, the computer 11 forming the position detection apparatus 10 can include a template TP, a CPU (or processor) 12, and a memory 13. The template TP can be installed in the computer 11 by being stored in a nonvolatile memory or the like. The template TP is programmable. The template TP may also be stored in the memory 13. The memory 13 stores the position detection program 15. The position detection program 15 can be provided to and installed in the computer 11 from a memory medium 30 storing the position detection program 15 via a memory reader (not shown) or a communication line (not shown). The CPU 12 operates based on the position detection program 15 stored in the memory 13, and causes the computer 11 to operation as a position detection apparatus, or causes the CPU 12 to operate as a position detector.

The position detection apparatus 10 detects the position of a detection target in an image provided from an image provider 20, by template matching using the template TP. The detection target can be, for example, a mark image. The image provider 20 can be, for example, an image capture (for example, a camera). This image capture can form a part of an alignment scope for capturing an image of a mark (alignment mark) formed on a substrate.

FIG. 2A shows an example of the template TP. The template TP can include a plurality of feature points TP1 to TP20 indicating the feature of a comparative image MAT corresponding to a detection target (for example, a mark image) MA. Each of the plurality of feature points TP1 to TP20 can be formed by coordinates (a position) on the template TP, and values at the coordinates. In this example shown in FIG. 2A, the feature points TP1 to TP20 are arranged on the edges of the comparative image MAT.

Figure 2B:
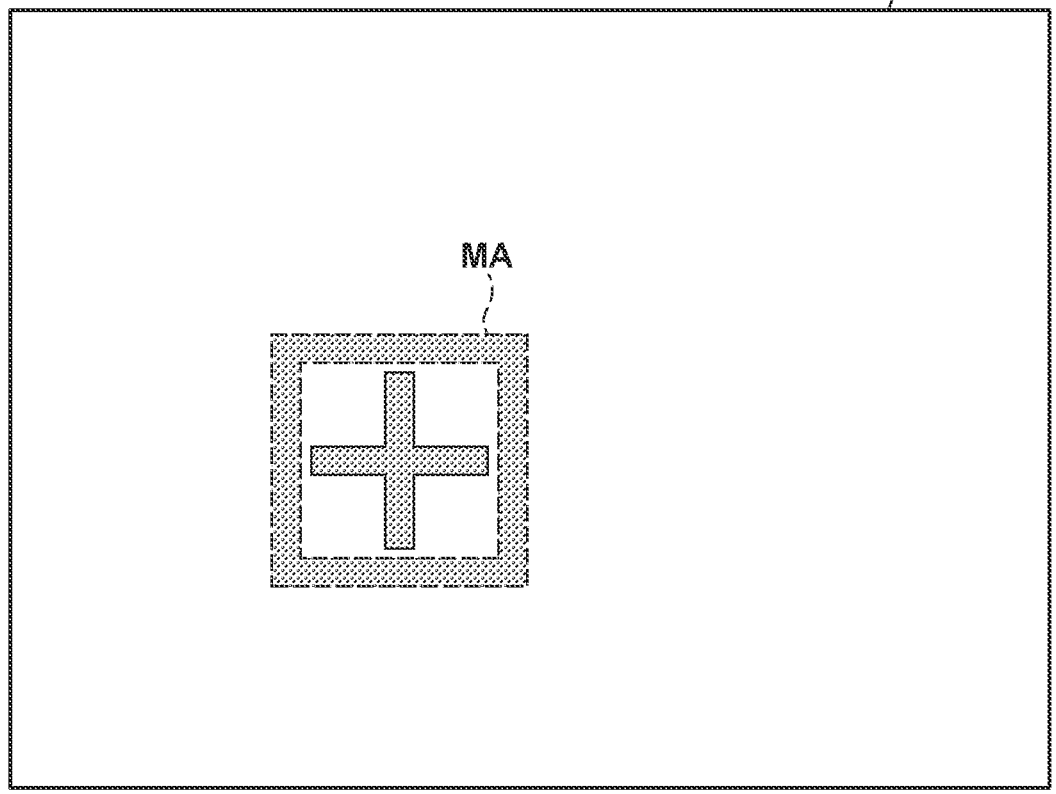
FIG. 2B is an exemplary view showing an image containing a mark image according to the embodiment of the present invention.

FIG. 2B shows an example of a search area AR of an image IM containing the detection target (for example, a mark image) MA. The image IM can be provided from the image provider 20. The image IM can be formed by a plurality of pixels, and a position in the image can be expressed by the coordinates (position) of a pixel. To detect the position of the target MA in the search area AR, the position detection apparatus 10 can be so configured as to calculate the correlation between the image IM and the template TP at each position in the search area AR while scanning the template TP within the search area AR. In other words, the position detection apparatus 10 can be so configured as to calculate the correlation between the image IM and the template TP at each of a plurality of relative positions of the template with respect to the search area AR, while changing the relative positions. Then, the position detection apparatus 10 can be so configured as to detect the position of the target MA based on one of the plurality of relative positions where the correlation between the image IM and the template TP is highest. The relative position can be a relative position between the central positions of the image IM and template TP.

As an example, a method of calculating an index indicating the correlation between the image IM and the template TP by normalized correlation will be explained below. However, this index may also be calculated in accordance with another method such as the SSD or SAD. The calculation amount of the normalized correlation is larger than those of the SSD and SAD, but the method is relatively strong against fluctuations in brightness and hence capable of stably detecting targets. This index indicating the correlation complying with the normalized correlation can be defined as a correlation degree C. The larger the correlation degree C., the higher the correlation. That is, this means that the target MA in the image IM and the template TP match with higher accuracy. The correlation degree C. at a position (x, y) in the image IM is a correlation degree when the center of the template TP is matched with the position (x, y) in the image IM. The position detection apparatus 10 can be so configured as to calculate the correlation degree C. at the position (x, y) in the image IM in accordance with equation (1). It is also possible to understand that the position (x, y) in the image IM represents the relative position between the image IM and the template TP.

$$C = \frac{\sum_{n=1}^{N}(I(n) \cdot T(n))}{\sqrt{\sum_{n=1}^{N} I(n)^2} \cdot \sqrt{\sum_{n=1}^{N} T(n)^2}} \times 100\,[\%] \qquad (1)$$

where N is the number of feature points, T(n) is the value of the nth feature point (TPn) in the template TP, and I(n) is the value of a pixel corresponding to T(n) in the image IM. Letting (xtn, ytn) be the position of the nth feature point in the template TP, I(n)=I(x+xtn, y+ytn) holds. The position detection apparatus 10 can be so configured as to determine that relative position (x, y)=(X, Y) where the correlation between the image IM and the template TP is highest among a plurality of relative positions (x, y) is position (x, y)=(X, Y) of the target MA.

The CPU (processor) 12 of the computer 11 forming the position detection apparatus 10 repeats processing on each of a plurality of relative positions of the template TP with respect to the image IM by changing the relative positions, while sequentially using the first to Nth feature points as a feature point of interest. Thus, the CPU 12 obtains the correlation degree C. as an index indicating the correlation between the template TP and the image IM, for each of the plurality of relative positions. This operation is equivalent to obtaining the correlation degree (correlation) between the template TP and the image IM for each of the plurality of positions (x, y) in the image IM.

When the feature point of interest is the Jth (J is a natural number which is 2 or more and less than N) feature point in the processing performed on each of the plurality of relative positions by the CPU 12, the CPU 12 judges whether an intermediate index obtained based on the processing of the first to Jth feature points satisfies a censoring condition. Then, if the intermediate index satisfies the censoring condition, the CPU 12 cancels processing for the (J+1)th and subsequent feature points. The Jth feature point is a feature point for judging whether to perform cancellation. In the following description, therefore, the Jth feature point will also be called a feature point J for judgement. The feature point J for judgement can be predetermined or preset before executing the detection process of detecting the position of the detection target MA in the image IM. Also, the censoring condition can be predetermined before executing the detection process of detecting the position of the detection target MA in the image IM.

That is, the position detection apparatus 10 or CPU 12 can include a determination unit for determining the feature point for judgement and/or the censoring condition. Alternatively, the position determination method to be executed by the position detection apparatus 10 or CPU 12 can include a determination step of determining the feature point for judgement and/or the censoring condition. The first to third examples of the setting for determining the feature point for judgement and/or the censoring condition will be explained below.

First Example

Figure 3B:
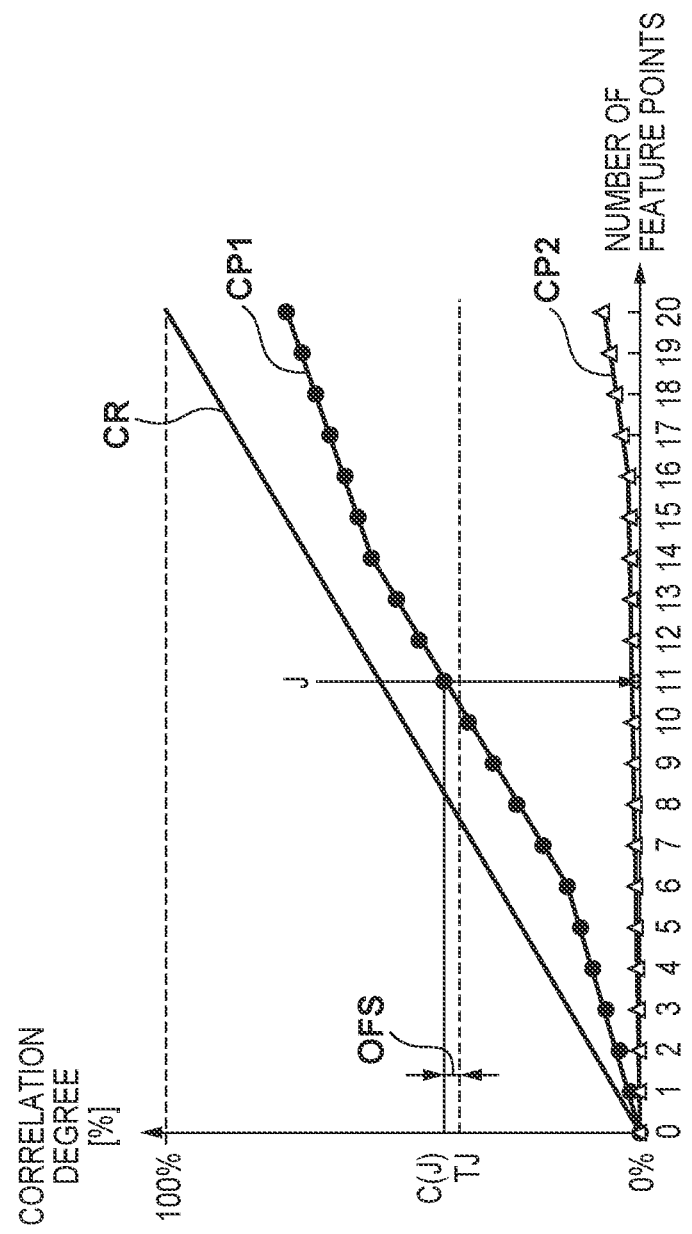
FIG. 3B is an exemplary view showing the distribution and transition of a correlation degree between an image and the template.

The first example of determining the feature point for judgement and/or the censoring condition will be explained with reference to FIGS. 3A and 3B. The correlation degree C. at each position (the relative position between the image IM and the template TP) in the search area AR can be obtained as shown in FIG. 3A. In this example, the correlation degree C. in a central position P1 (that is, (x, y)=(0, 0)) of the target (mark image) MA is 80%. Also, the correlation degree C. in a given peripheral position P2 outside the target (mark image) MA is 15%. Thus, the correlation degree C. (correlation) is high in the center and its vicinity of the target MA where the positions of the target MA and template TP match. On the other hand, the correlation degree C. (correlation) is low in the peripheral position outside the target MA and in a position where the target MA does not exist.

FIG. 3B plots a transition CP1 of the correlation degree C. at each of the first to 20th feature points in the central position P1 of the target MA, and a transition CP2 of the correlation degree C. at each of the first to 20th feature points in the peripheral position P2 outside the target MA. A correlation degree C.(j) at the jth feature point Tj is given by equation (2). A range which j can take is 1≤j≤N. More accurately, the correlation degree C.(j) at the jth feature point Tj is an index indicating the result of evaluation on the correlation between the template TP and the image IM (the target MA) from the first feature point to the jth feature point.

$$C(j) = \frac{\sum_{n=1}^{j}(I(n) \cdot T(n))}{\sqrt{\sum_{n=1}^{j} I(n)^2} \cdot \sqrt{\sum_{n=1}^{j} T(n)^2}} \times \frac{j}{N} \times 100\,[\%] \quad (2)$$

The transition of an ideal correlation degree C. when the position of the target MA in the image IM and the position of the template TP perfectly match is CR. The slope of the transition CR of the ideal correlation degree C. is 1/N, and the slope of an actual correlation degree C.(j) does not exceed the slope of CR. As shown in FIG. 3B, the contrast in the outer frame portion of the target (mark image) MA is low, so the transition CP1 shows that the increase amount of the correlation degree is low at each of the feature points TP1 to TP6 and TP14 to TP20 of the template TP. By contrast, the cross-shaped portion near the center of the target (mark image) MA well matches the feature points TP7 to TP13, so the increase amount of the correlation degree is large like that of the ideal slope. On the other hand, the transition CP2 shows that the correlation degree is leveling off because the degree of matching between the image IM and each feature point of the template TP is low. In the transition CP2, however, the correlation degree slightly increases because TP18 to TP20 match the outer frame portion of the target MA.

The position detection apparatus 10 or CPU 12 can obtain the transition CP1 as shown in FIG. 3B by calculating the correlation degree in accordance with equation (2) for each of a plurality of relative positions between a test image and the template TP while changing the relative positions. Also, the position detection apparatus 10 or CPU 12 can determine the feature point J for judgement based on the transition CP1 obtained by using the test image. When processing a lot including a plurality of substrates, for example, the test image can be an image obtained by capturing an image of a mark on the first substrate of the lot in order to detect the position of the mark on the first substrate.

A case in which a correlation degree threshold TJ is predetermined as the censoring condition will be explained. In this case, the position detection apparatus 10 or CPU 12 determines that a feature point by which the correlation degree in the central position of the target MA exceeds the correlation degree threshold TJ and the correlation degree in the peripheral position outside the target MA is smaller than TJ is the feature point J for judgement. For example, in FIG. 3B, the correlation degree at each feature point of the transition CP1 of the correlation degree in the central position of the target MA exceeds the correlation degree threshold TJ where the number of feature points is 11 or more. When the number of feature points is 11 on the transition CP2 of the correlation degree in the peripheral position outside the target MA, the correlation degree is smaller than TJ. Accordingly, the position detection apparatus 10 or CPU 12 can determine that the feature point where the number of feature points is 11, that is, the 11th feature point is the feature point J for judgement. The correlation degree threshold TJ can be predetermined as described above.

Alternatively, the position detection apparatus 10 or CPU 12 may also determine the correlation degree threshold TJ based on a predetermined feature point J for judgement and the transition CP1 of the correlation degree in the central position P1 of the target MA. For example, a value obtained by subtracting an arbitrary offset OFS from a correlation degree C.(J) at the feature point J for judgement on the transition CP1 of the correlation degree can be determined as the correlation degree threshold TJ. The feature point J for judgement and correlation degree threshold TJ herein determined are used when detecting the position of the target MA by using the image IM as a target.

Second Example

Figure 4A:
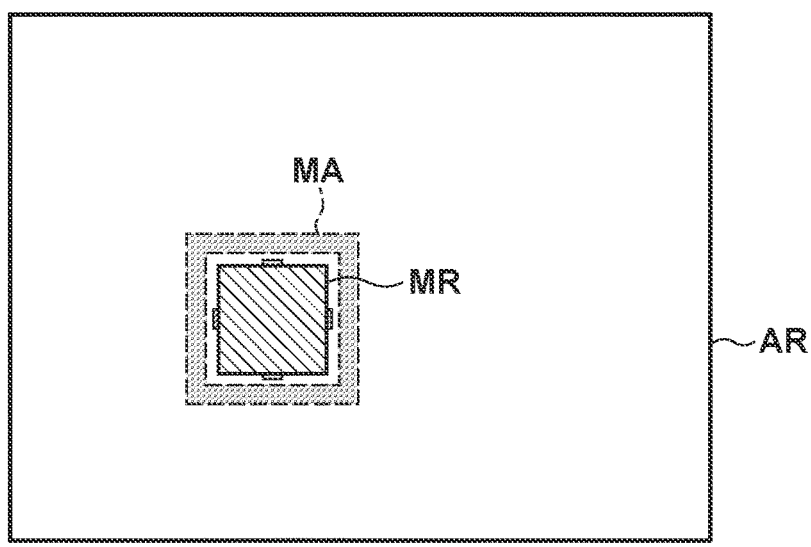
FIG. 4A is an exemplary view of the image.
Figure 4B:
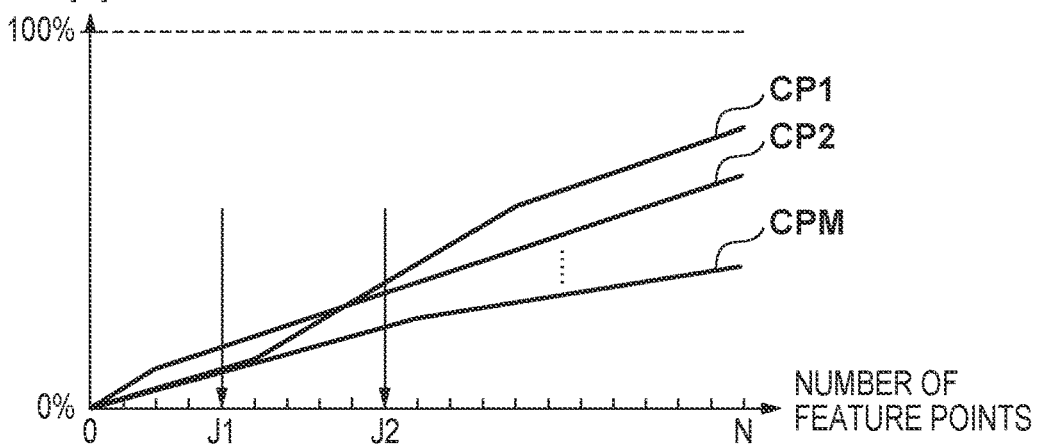
FIG. 4B is an exemplary view showing the transition of a correlation degree in a central region of a detection target.
Figure 4C:
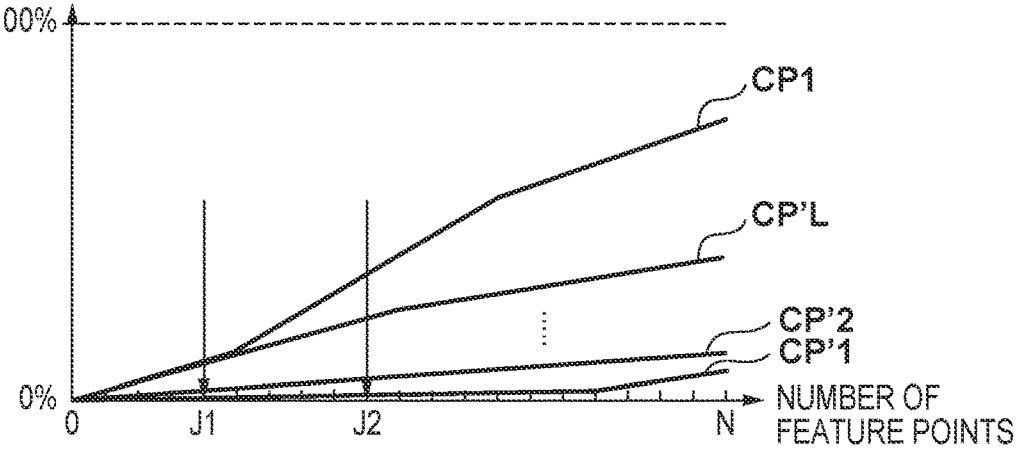
FIG. 4C is an exemplary view showing the transition of a correlation degree in a peripheral region of the detection target.

The second example of determining the feature point for judgement and/or the censoring condition will be explained below with reference to FIGS. 4A to 4C and FIG. 5. In this example, the number of pixels in the central region MR of the target MA is M, and the number of pixels in a region (peripheral region) different from the central region MR is L. Also, as shown in FIG. 4B, transitions CP1, CP2, ..., CPM of the correlation degree are obtained in the positions of the M pixels (M relative positions) forming the central region MR. Similarly, as shown in FIG. 4C, transitions CP'1, CP'2, ..., CP'L of the correlation degree are obtained in the positions of the L pixels (L relative positions) forming the region different from the central region MR. The transition of the correlation degree in the position of the central pixel of the target MA is CP1.

Figure 5:
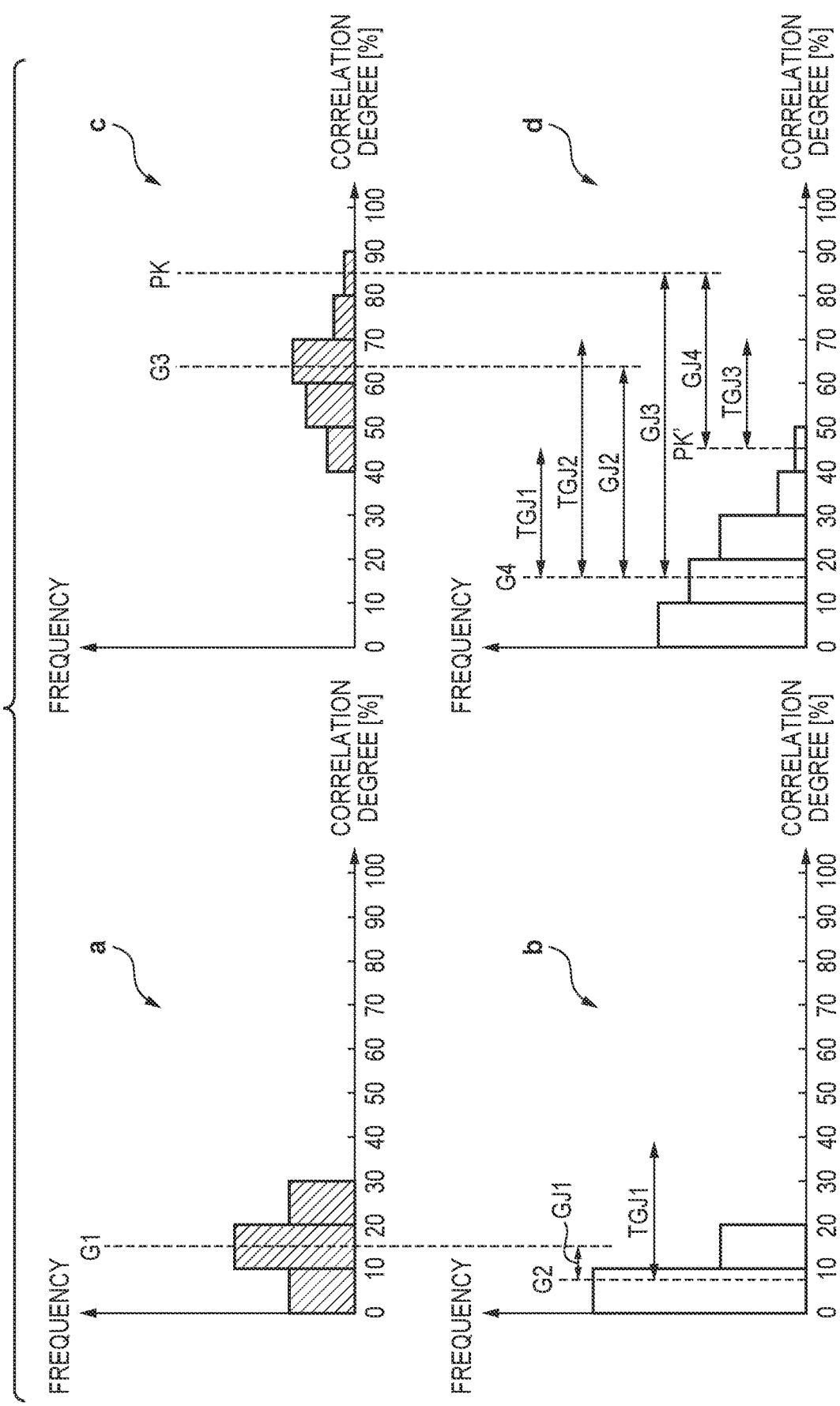
FIG. 5 is an exemplary view showing the frequencies of correlation degrees at two feature points.

Then, the position detection apparatus 10 or CPU 12 obtains the frequency of the correlation degree of CP1 to CPM and CP'1 to CP'L at each of feature points J1 and J2. For example, a in FIG. 5 shows the frequency of the correlation degree of CP1 to CPM at the feature point J1, and b in FIG. 5 shows the frequency of the correlation degree of CP'1 to CP'L at the feature point J1. Also, c in FIG. 5 shows the frequency of the correlation degree of CP1 to CPM at the feature point J2, and d in FIG. 5 shows the frequency of the correlation degree of CP'1 to CP'L at the feature point J2.

An example of the first method of determining a feature point for judgement and a correlation degree threshold at the feature point for judgement is a determination method based on whether correlation degree frequency distributions at individual feature points are sufficiently separated. More specifically, the barycenter of each frequency is obtained. The barycenter of the correlation degree frequency of CP1 to CPM obtained at the feature point J1 is G1, and the barycenter of the correlation degree frequency of CP'1 to CP'L obtained at the feature point J1 is G2. Also, barycenter of the correlation degree frequency of CP1 to CPM obtained at the feature point J2 is G3, and the barycenter of the correlation degree frequency of CP'1 to CP'L obtained at the feature point J2 is G4.

At the feature point J1, there is no large difference between the correlation degree obtained when the center of the template TP is matched with a pixel in the central region MR of the target MA, and the correlation degree obtained when the center of the template TP is matched with a pixel in a region different from the central region MR. Accordingly, a difference GJ1 between the barycenters G1 and G2 is small. On the other hand, at the feature point J2, there is a large difference between the correlation degree obtained when the center of the template TP is matched with a pixel in the central region MR of the target MA, and the correlation degree obtained when the center of the template TP is matched with a pixel in a region different from the central region MR. Accordingly, a difference GJ2 between the barycenters G3 and G4 is large. The position detection apparatus 10 or CPU 12 can determine that the feature point J2 at which the barycenter difference is larger than a threshold TGJ1 is the feature point for judgement by comparing the barycenter difference with the threshold TGJ1. In addition, the position detection apparatus 10 or CPU 12 can determine that a value obtained by subtracting an arbitrary offset from the correlation degree of CP1 at the determined feature point J2 for judgement is the correlation degree threshold TJ. This method can stably determine the feature point for judgement, even if there is an abnormal value, by comparing the correlation degree frequencies obtained for a plurality of pixels in the central region of the target MA and a region different from the central region.

Next, the second method of determining a feature point for judgement and a correlation degree threshold at the feature point for judgement will be explained. The second method determines whether the correlation degree distribution when the center of the template TP is matched with a pixel in the central region of the target MA and the correlation degree distribution when the center of the template TP is matched with a region different from the central region are sufficiently separated.

As shown in c of FIG. 5, the correlation degree at the feature point J2 is PK when the center of the template TP is matched with a pixel in the center of the central region MR of the target MA. A difference between the correlation degree PK when the center of the template TP is matched with the pixel in the center of the central region MR of the target MA, and the barycenter G4 of the frequency of the correlation degree G4 when the center of the template TP is matched with pixels in regions different from the central region MR of the target MA, is GJ3. If the difference GJ3 exceeds a threshold TGJ2, the feature point J2 is the feature point for judgement. The correlation degree threshold TJ can be obtained by the same method as described above. The second method can determine a feature point for judgement and correlation degree threshold faster than the first method.

The third method of determining a feature point for judgement and a correlation degree threshold at the feature point for judgement will be explained below. The third method compares a correlation degree obtained when the center of the template TP is matched with a pixel in the center of the central region MR of the target MA, with a highest correlation degree obtained for pixels in regions different from the central region MR. At the feature point J2, the highest correlation degree obtained for pixels in regions different from the central region MR is PK'. If a difference GJ4 between the correlation degrees PK and PK' exceeds a threshold TGJ3, the position detection apparatus 10 or CPU 12 determines that this feature point is the feature point J2 for judgement. The correlation degree threshold TJ can be obtained by the same method as described above. The third method can perform determination faster than the first and second methods.

Third Example

The third example of determining the feature point for judgement and/or the censoring condition will now be explained with reference to FIGS. 6A and 6B. In the third example, the order of a plurality of feature points of the template TP is redefined by rearranging the plurality of feature points. In other words, the position detection apparatus 10 or CPU 12 can include a redefining unit for redefining the first to Nth feature points by rearranging them. A position determination method to be executed by the position detection apparatus 10 or CPU 12 can include a redefining step of redefining the first to Nth feature points by rearranging them.

Figure 6A:
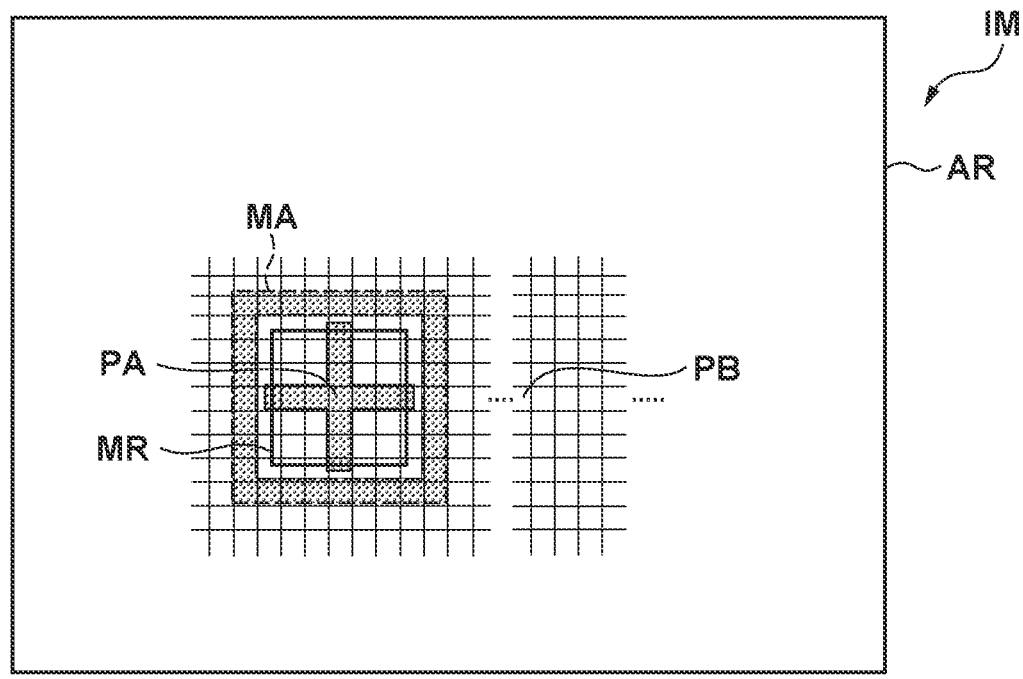
FIG. 6A is a view for explaining a method of optimizing a feature point for judgement.
Figure 6B:
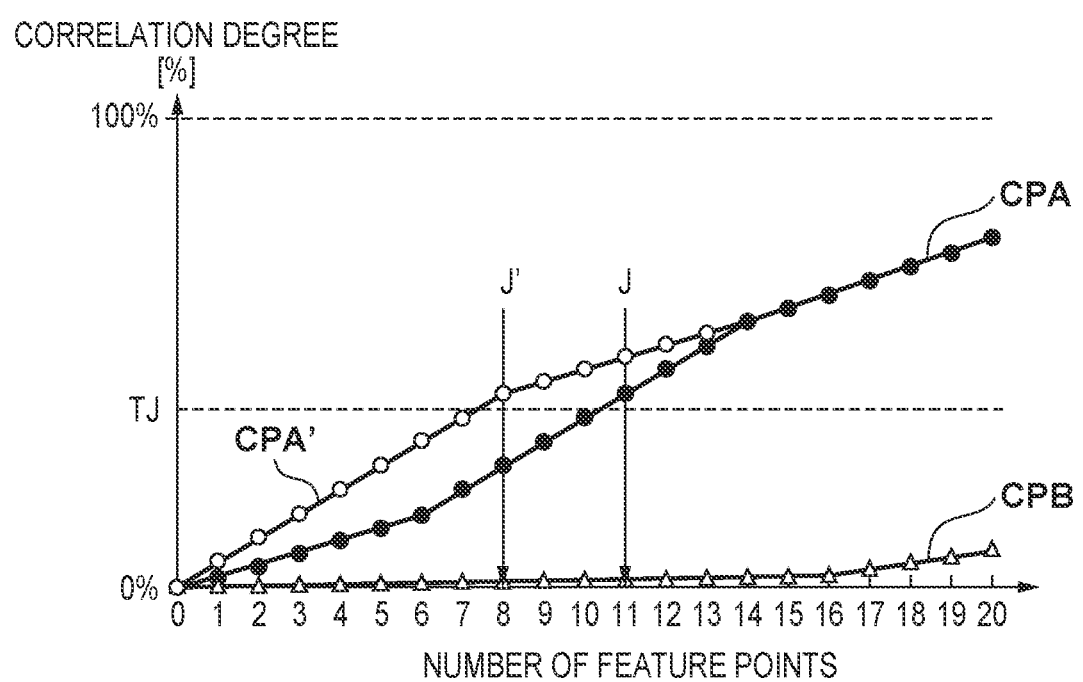
FIG. 6B is a view for explaining the method of optimizing a feature point for judgement.
Figure 7:
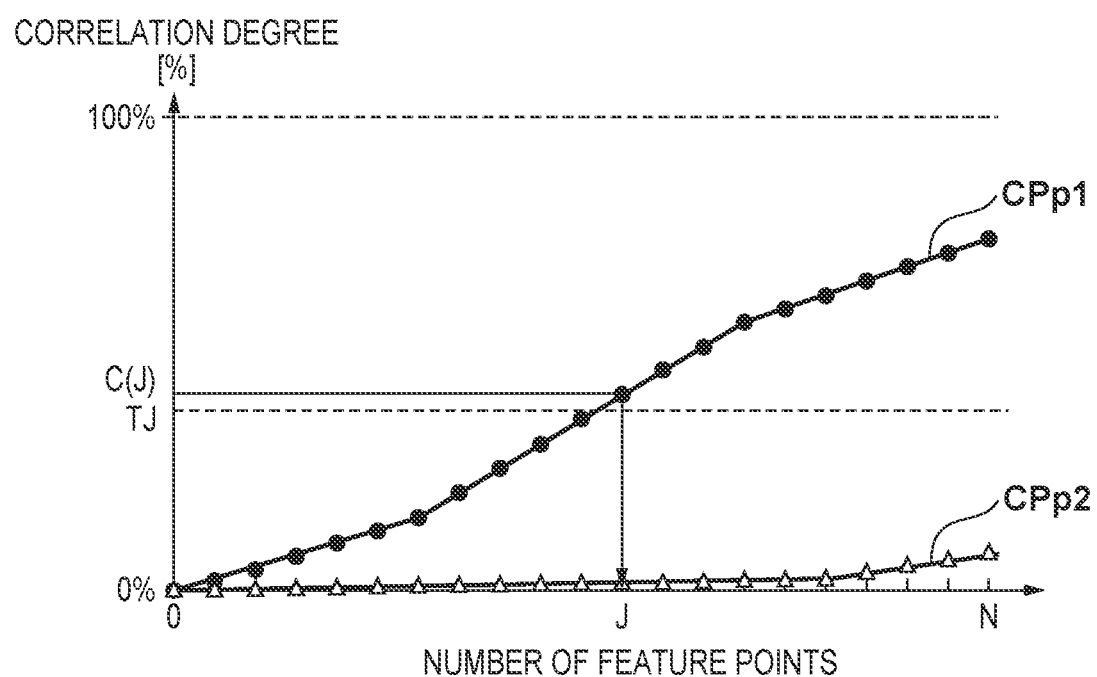
FIG. 7 is an exemplary view showing the transition of a correlation degree.
Figure 8:
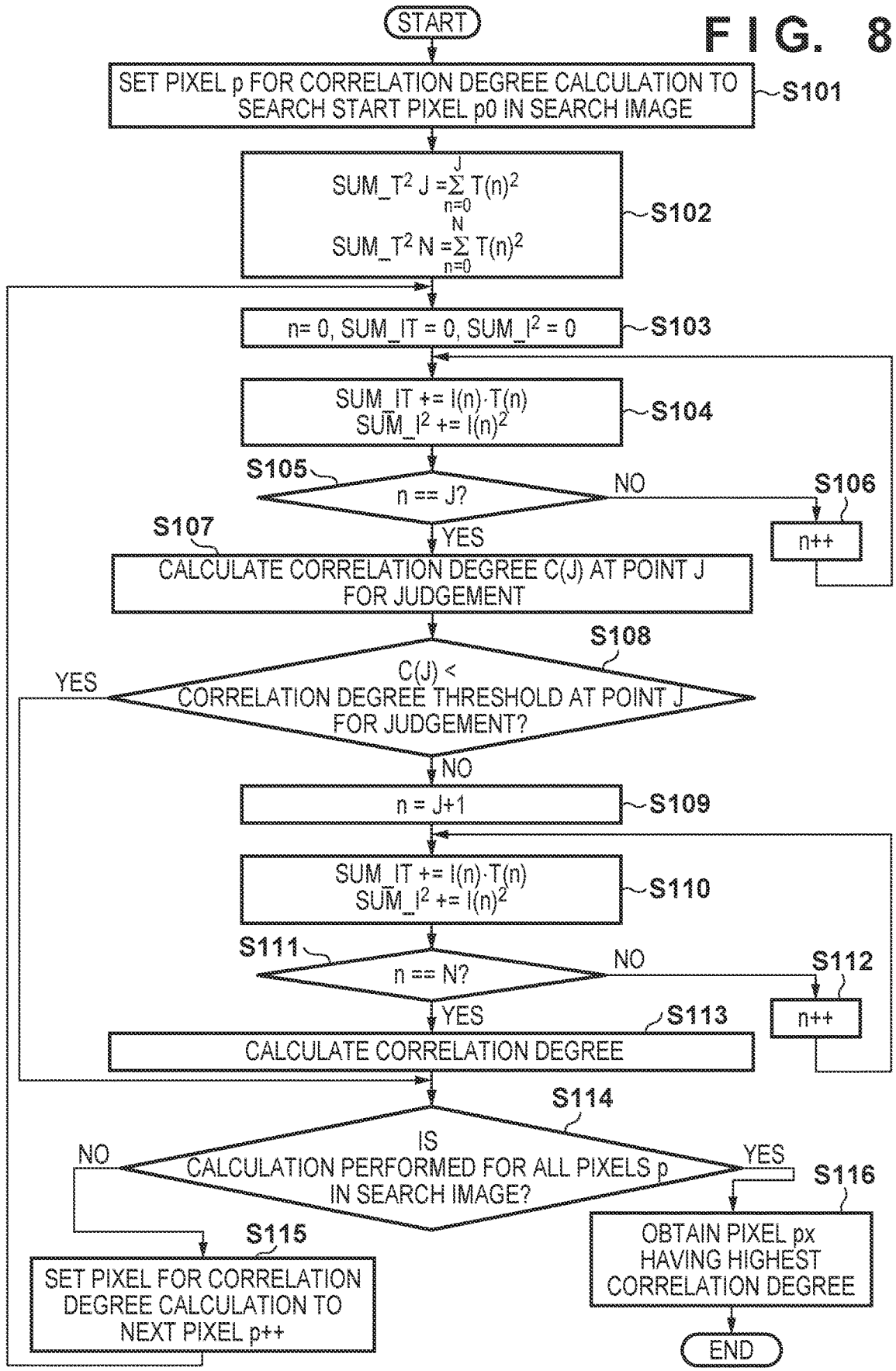
FIG. 8 is an exemplary view showing the procedure of detecting the position of a target performed by the position detection apparatus of the embodiment of the present invention.

As shown in FIGS. 6A and 6B, the transition of a correlation degree obtained when the center of the template TP is matched with a pixel PA in the center of the target MA is CPA. Letting TJ be a correlation degree threshold at a feature point for judgement, the feature point for judgement is J from the relationship between the transition CPA of the correlation degree and the correlation degree threshold TJ. The transition CPA of the correlation degree has the feature that the degree of matching between the template TP and the target MA is high when number of feature points=7 to 14, so the increase amount of the correlation degree is large. Therefore, a transition CPA' of an optimized correlation degree is formed by rearranging the first to Nth feature points. More specifically, the transition CPA' of the correlation degree is a graph obtained when the feature points of the template TP shown in FIG. 1 are calculated in the order of TP7, TP8, . . . , TP14, TP1, TP2, . . . , TP6, TP15, TP16, . . . , TP20. The feature point for judgement can be determined as J' from the relationship between the transition CPA' of the correlation degree and the correlation degree threshold TJ. This makes it possible to judge whether to cancel the correlation degree calculation in earlier stages. This method can determine a more optimum point for judgement by performing optimization by taking account of the transition of a correlation degree at a pixel in a region different from the central region MR of the target MA.

For example, on a correlation degree transition CPB at a pixel PB in a region different from the central region MR shown in FIGS. 6A and 6B, the correlation degree relatively increases by calculations of number of feature points=17 to 20. When rearranging a plurality of feature points, a feature point at which the correlation degree transition in the central region MR of the target MA is large and the correlation degree transition in a region different from the central region MR of the target MA is small is preferably put forth. This increases the difference between the correlation degree transition in the central region MR of the target MA and the correlation degree transition in the outside region. Accordingly, judgement can be performed earlier.

An example of the target position detection procedure executable by the position detection apparatus 10 or CPU 12 will be explained below with reference to FIGS. 2A, 2B, 7, and 8. The following procedure is executed in a state in which the feature point for judgement and censoring condition are predetermined and preset by the method represented by the abovementioned first to third examples.

In step S101, the CPU 12 sets a search start pixel in the search area AR of the image IM to p0. Then, the CPU 12 calculates the sum of squares of template values at the individual feature points of the template TP, which is a part of the denominator of equation (1). This calculation of the sum of squares includes the calculation of SUM_T²J as the sum of squares of T(n) from the first feature point to the Jth feature point (the feature point for judgement), and the calculation of SUM_T²N as the sum of squares of T(n) from the first to Nth feature points. These sums of squares are fixed values and hence can be calculated beforehand. SUM_T²N and SUM_T²J are calculated in accordance with equation (3).

$$SUM\_T^2J = \sum_{n=0}^{J} T(n)^2 \qquad (3)$$

$$SUM\_T^2N = \sum_{n=0}^{N} T(n)^2$$

Then, in step S103, the CPU 12 initializes a variable n, a sum of products SUM_IT, and a sum of squares SUM_I² to 0, before starting the calculation of a correlation degree C.(J) for a pixel p as a correlation degree calculation target. The variable n indicates a number for identifying a feature point of interest as a feature point currently being calculated. The sum of products SUM_IT is the sum of products of a value I(n) of a pixel (a pixel corresponding to a feature point TPn) in the search area AR of the image IM, and a value T(n) of the template TP at the feature point TPn. The sum of squares SUM_I² is the sum of products of squares of I(n).

In steps S104 to S106, the CPU 12 calculates the value of a function for calculating the correlation degree C.(J) while sequentially setting the first to Jth (J is a natural number which is 2 or more and less than N) feature points as a feature point of interest. In other words, in steps S104 to S106, the CPU 12 calculates the value of the function for calculating the correlation degree C.(J) until the variable n indicating the feature point of interest reaches J. It can be understood that the value of the function is an index value indicating the correlation between the template TP and the image IM in relation to the feature point.

More specifically, in step S104, the CPU 12 calculates the value of a first function of obtaining the product of I(n) and T(n), and adds the product to SUM_IT. This operation is equivalent to a first integration of integrating the values of the first function (a first integration of calculating the sum of the values of the first function). Also, in step S104, the CPU 12 calculates the value of a second function of obtaining the square of I(n), and adds the product to SUM_I². This operation is equivalent to a second integration of integrating the values of the second function (a second integration of calculating the sum of the values of the second function). In step S105, the CPU 12 determines whether the value of the variable n is J. If the value of the variable n is not J (if n is smaller than J), the CPU 12 adds 1 to the present value of the variable n in step S106, and returns to step S104. If the value of the variable n is J (if the feature point of interest is the Jth feature point (that is, the feature point J for judgement)), the CPU 12 advances to step S107.

In step S107, the CPU 12 calculates the correlation degree C.(J) at the feature point J for judgement by using equation (2) (S107). Based on SUM_IT and SUM_I² (index values indicating the correlation) obtained by repeating the calculations in steps S104 to S106, the CPU 12 calculates C(J) as an intermediate index at the Jth feature point in accordance with equation (4). Equation (4) is equivalent to equation (2). C(J) is a correlation degree obtained at the feature point J for judgement. In other words, C(J) is an intermediate index obtained based on the calculations from the first feature point to the Jth feature point (the feature point for judgement).

$$C(j) = \frac{SUM\_IT}{\sqrt{SUM\_I^2 \times SUM\_T^2 J}} \times \frac{j}{N} \times 100\,[\%] \qquad (4)$$

In step S108, the CPU 12 determines whether C(J) satisfies the censoring condition, more specifically, whether C(J) is smaller than the correlation degree threshold TJ. In this example, C(J) satisfies the censoring condition if C(J) is smaller than the correlation degree threshold TJ. If C(J) satisfies the censoring condition, the CPU 12 cancels calculations for the (J+1)th and subsequent feature points, and advances to step S114.

On the other hand, if C(J) does not satisfy the censoring condition, the CPU 12 advances to step S109. Then, in steps S109 to S113, the CPU 12 calculates a correlation degree C.(N) as an index indicating the correlation between the template TP and the image IM based on the calculations from the first feature point to the Nth (N is a natural number which is 3 or more) feature point.

More specifically, in steps S109 to S112, the CPU 12 calculates the value of a function for calculating the correlation degree C.(J) while sequentially setting the (J+1)th to Nth feature points as the feature point of interest. In other words, in steps S109 to S112, the CPU 12 calculates the value of the function for calculating the correlation degree C.(N) until the variable n indicating the feature point of interest reaches N. More specifically, the value of the variable n is set to J+1 in step S109. Subsequently, in step S110, the CPU 12 calculates the value of a first function of obtaining the product of I(n) and T(n), and adds the product to SUM_IT. This operation is equivalent to a first integration of integrating the values of the first function (a first integration of calculating the sum of the values of the first function). Also, in step S110, the CPU 12 calculates the value of a second function of obtaining the square of I(n), and adds the product to SUM_I². This operation is equivalent to a second integration of integrating the values of the second function (a second integration of calculating the sum of the values of the second function). In step S111, the CPU 12 determines whether the value of the variable n is N. If the value of the variable n is not N (if n is smaller than N), the CPU 12 adds 1 to the present value of the variable n in step S112, and returns to step S110. If the value of the variable n is N (if the feature point of interest is the last feature point), the CPU 12 advances to step S113. In step S113, based on SUM_IT and SUM_I² obtained by repeating steps S104 to S106 and steps S110 to S112, the CPU 12 calculates C(N) as an index at the Nth feature point in accordance with equation (5). Equation (5) is equivalent to equation (1).

$$C = \frac{SUM\_IT}{\sqrt{SUM\_I^2 \times SUM\_T^2 J}} \times 100 \, [\%] \qquad (5)$$

The repetition of steps S104 to S106 and steps S110 to S112 is a calculation step of obtaining the correlation degree C. as an index indicating the correlation between the template TP and the image IM by repeating the calculations while sequentially setting the first to nth feature points as the feature point of interest.

In step S114, the CPU 12 determines whether the abovementioned processing (steps S103 to S108 or steps S103 to S113) has been executed for all pixels p in the search area AR. If unprocessed pixels p exist among all the pixels p in the search area AR, the CPU 12 changes the processing target pixel to one of the unprocessed pixels p in step S115, and returns to step S103. On the other hand, if the abovementioned processing has been executed for all the pixels p in the search area AR, the CPU 12 advances to step S116, determines a pixel p having the highest correlation degree C., and determines that position (x, y)=(X, Y) of the pixel p is position (x, y)=(X, Y) of the target MA.

Figure 9A:
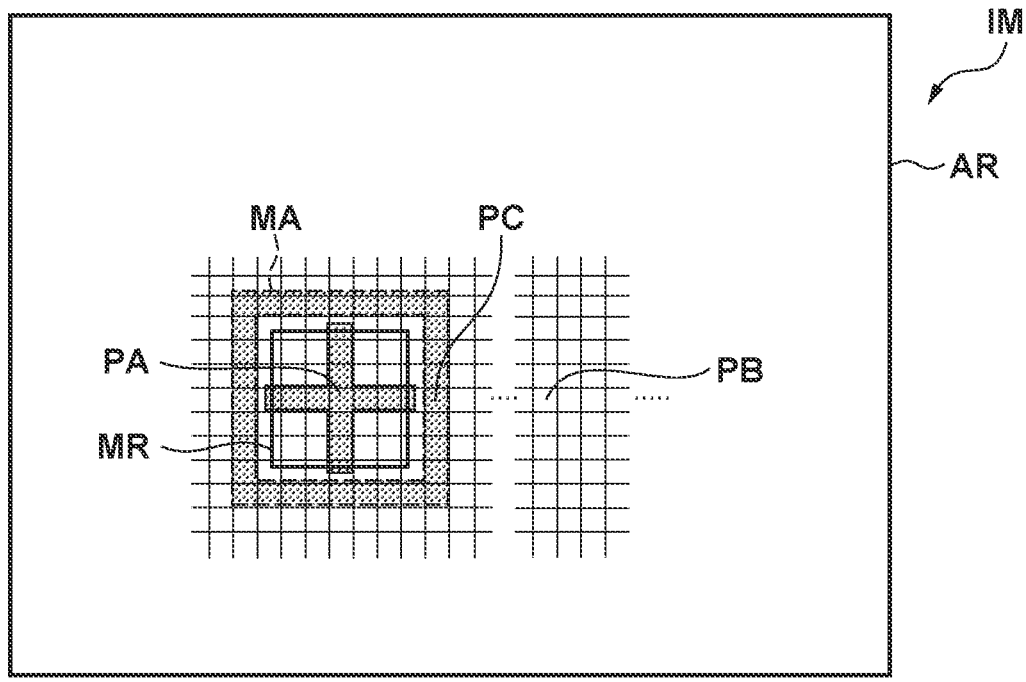
FIG. 9A is an exemplary view showing a modification of the procedure of detecting the position of a target performed by the position detection apparatus of the embodiment of the present invention.
Figure 9B:
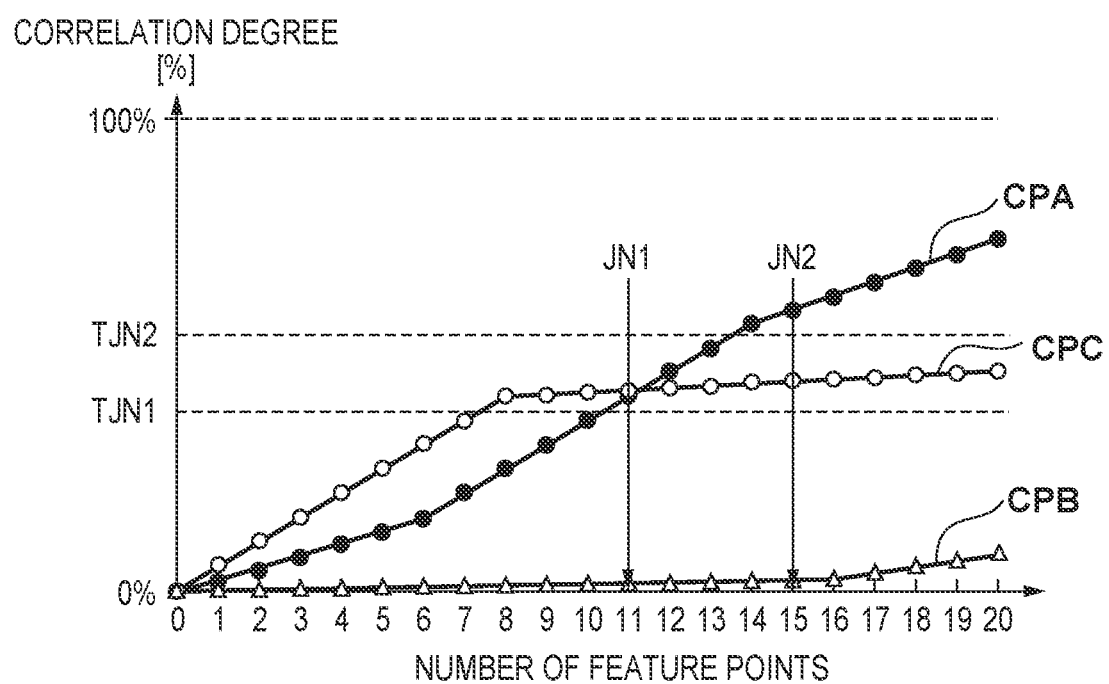
FIG. 9B is an exemplary view showing the modification of the procedure of detecting the position of a target performed by the position detection apparatus of the embodiment of the present invention.

A modification of the target position detection procedure executable by the position detection apparatus 10 or CPU 12 will be explained below with reference to FIGS. 9A and 9B. As shown in FIGS. 9A and 9B, let CPA be a correlation degree transition at a pixel PA in the center of the central region MR of the target MA, CPB be a correlation degree transition at a pixel PB in a region different from the central region MR, and CPC be a correlation degree transition at another pixel PC in the region different from the central region MR. The increase amount of the correlation degree is large because the correlation degree transition CPC well matches the feature points TP1 to TP8 of the template TP, but is small after that because there is no matching. A correlation degree transition like this sometimes occurs when a feature point of the template TP overlaps a mark or another pattern. Letting JN1 be the first feature point for judgement and TJN1 be a correlation degree threshold at the first feature point JN1 for judgement, the correlation degree of the correlation degree transition CPC at the first feature point JN1 for judgement exceeds the correlation degree threshold TJN1, so the correlation degree calculation at the pixel PC cannot be canceled. On the other hand, letting JN2 be the second feature point for judgement and TJN2 be a correlation degree threshold at the second feature point JN2 for judgement, the correlation degree of the correlation degree transition CPC at the second feature point JN2 for judgement is smaller than the correlation degree threshold TJN2, so the correlation degree calculation at the pixel PC can be canceled. In this case, the timing at which the correlation degree calculation at the pixel PB is canceled is delayed, and this prolongs the time required for the correlation degree calculation at the pixel PB. Therefore, the position detection apparatus 10 or CPU 12 can be so configured as to judge whether to cancel the subsequent calculation at each of a plurality of feature points for judgement. In this example, the first and second feature points JN1 and JN2 for judgement are set, and whether to cancel the subsequent calculation is judged at each feature point for judgement. By setting a plurality of feature points for judgement, it is possible to cancel the correlation degree calculation at a pixel such as the pixel PC at which the correlation degree finally becomes lower than that of a pixel in the central position of the target MA, without increasing the correlation degree calculation time at a pixel such as the pixel PB at which the calculation can be canceled early. By increasing the number of feature points for judgement, it can be expected to cancel the correlation degree calculation at more pixels. However, the judgement time prolongs if the number of feature points for judgement is increased, so it is favorable to set feature points for judgement which can shorten the template matching time most.

As described above, the abovementioned embodiment provides a technique advantageous in detecting the position of a target within a shorter time period.

Figure 10:
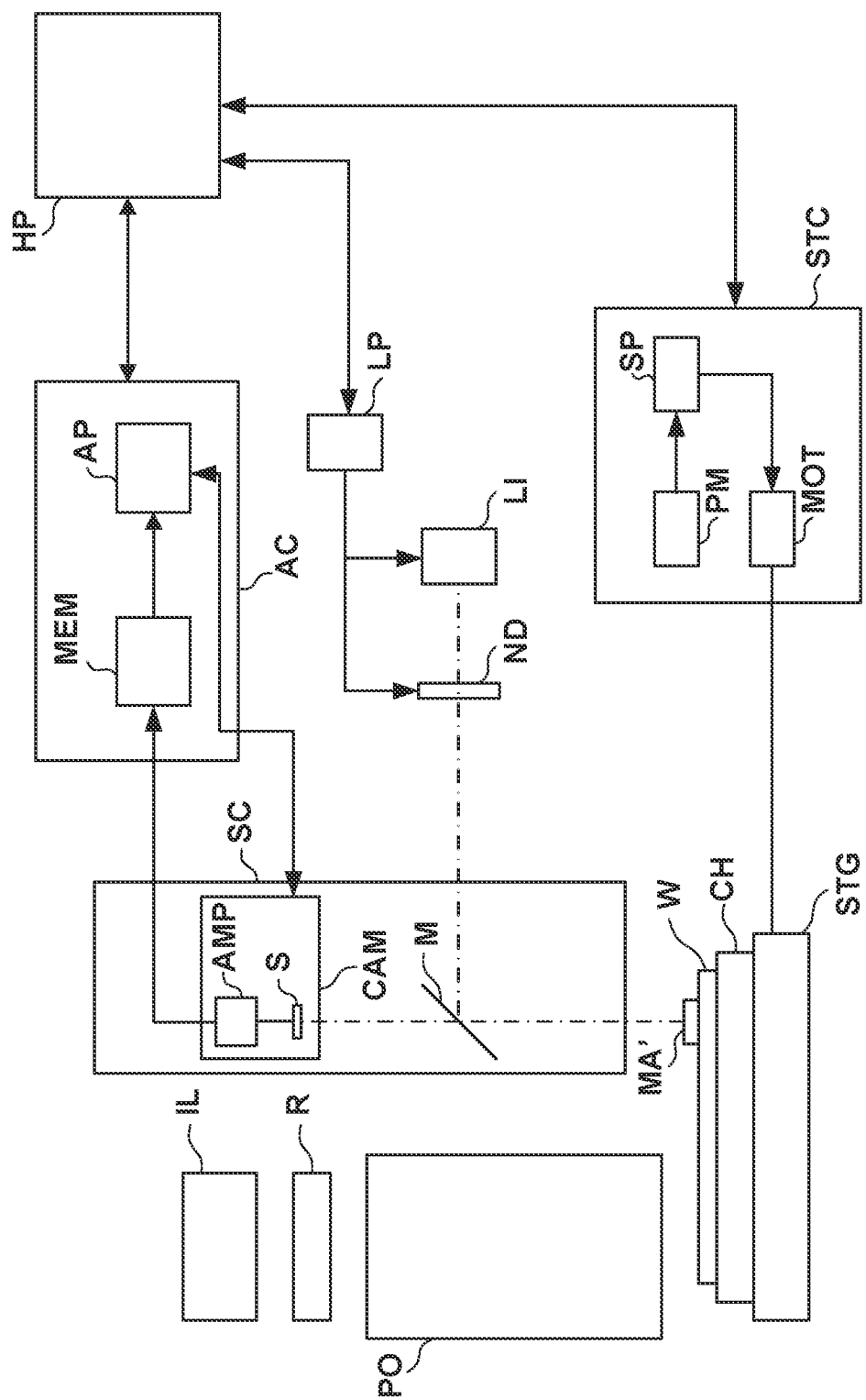
FIG. 10 is an exemplary view showing an exposure apparatus as a lithography apparatus incorporating the position detection apparatus.

An example in which the position detection apparatus 10 is applied to an exposure apparatus 100 as a lithography apparatus will be explained below with reference to FIG. 10. However, the position detection apparatus 10 is also applicable to another lithography apparatus such as an imprint apparatus or charged particle drawing apparatus.

The exposure apparatus 100 is an apparatus which aligns an original plate R and a substrate W with each other, and irradiates the original plate R with exposure light by an illuminating system IL, thereby transferring a pattern of the original plate R onto the substrate W via a projecting optical system PO. The substrate is held by a chuck CH mounted on an X-Y stage (positioning mechanism) movable in the X and Y directions. A mark MA' for aligning the substrate W is formed on the substrate W. The apparatus includes an alignment scope SC for capturing an image of the mark MA'. The alignment scope SC is equivalent to the image provider 20 described earlier. An ND filter ND adjusts the light quantity of light emitted from a light source LI. The light is then guided to a half mirror M by a fiber or dedicated optical system, and irradiates the mark MA' via the projecting optical system PO or the like. A light quantity adjuster LP controls the light source LI and ND filter ND. Reflected light from the mark MA' passes through the half mirror M, and enters a photosensor S of a camera CAM of the alignment scope SC, thereby forming an image of the mark MA'. This image of the mark MA' is sensed by the photosensor (image sensor) S, and A/D-converted by a sensor controller AMP. Consequently, an image containing the mark image as the detection target MA is output from the camera CAM (the alignment scope SC) to an alignment measurement device AC.

A host controller HP can control the accumulation time for image sensing by the photosensor S. More specifically, an alignment processor AP in the alignment measurement device AC controls the accumulation time by controlling the sensor controller AMP in accordance with an instruction from the host controller HP. The alignment processor AP controls the image sensing timing of the photosensor S based on a timing signal supplied from a stage processor SP in a stage controller STC to the alignment processor AP via the host controller HP. The stage processor SP drives the X-Y stage STG by a motor MOT, and measures the position of the X-Y stage STG by an interferometer PM.

The alignment measurement device AC stores the output image from the camera CAM (the alignment scope SC) in a memory MEM. The alignment processor AP incorporates the abovementioned position detection apparatus 10, and processes the image containing the mark image as the detection target MA, thereby detecting the position of the mark image as the target MA, and supplying the detection result to the host controller HP. The position detection apparatus incorporated into the alignment processor AP can be so configured as to determine at least one of the Jth feature point and censoring condition based on the attribute of the substrate. The position detection apparatus may also be so configured as to determine at least one of the Jth feature point and censoring condition based on an image pertaining to a specific substrate.

The host controller HP controls the position of the X-Y stage STG via the stage controller STC based on the position of the mark image. The feature point for judgement and/or the censoring condition can be determined for each process or each lot. This is so because the mark MA' and/or its base formed on the substrate W can change for each process or each lot.

In this example, the host controller HP, stage controller STC, and alignment measurement device AC form a control unit for controlling the X-Y stage STG (the positioning mechanism) based on the image obtained by the alignment scope SC including the camera CAM.

Figure 11:
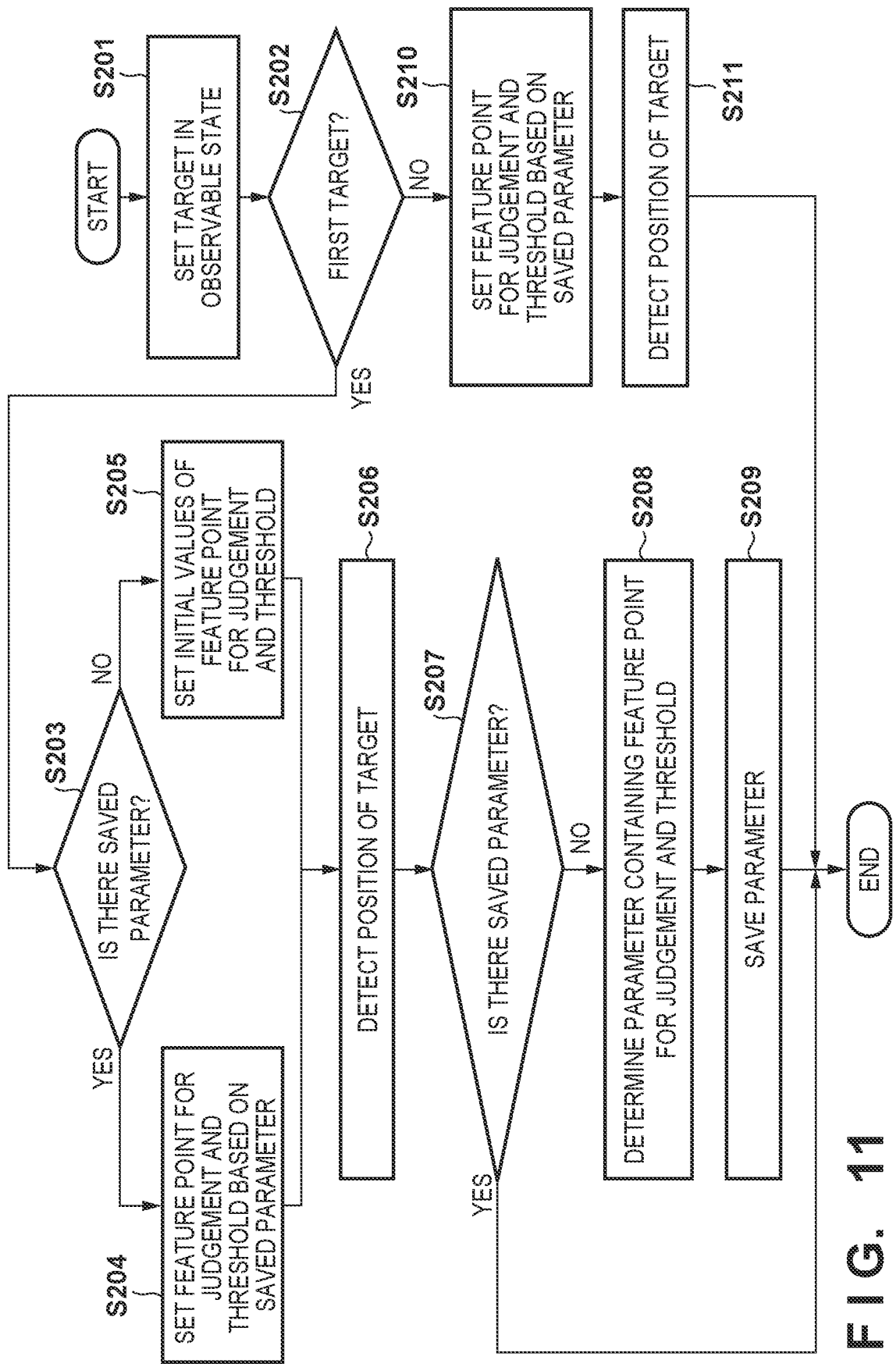
FIG. 11 is an exemplary view showing the operation of the exposure apparatus when detecting the position of a mark on a substrate.

FIG. 11 exemplarily shows the operation of the exposure apparatus 100 when detecting the position of a mark on the substrate W. The host controller HP controls this operation. In step S201, the host controller HP drives the X-Y stage STG such that a mark as the position detection target MA' enters the field of view of the alignment scope SC. In step S202, if there are a plurality of marks as the position detection targets MA', the host controller HP determines whether this target is the first target.

If this target is the first target, the host controller HP determines in step S203 whether a parameter containing the feature point for judgement and correlation degree threshold is saved. If the parameter is saved, the host controller HP sets the feature point for judgement and correlation degree threshold based on the saved parameter in step S204. On the other hand, if no parameter is saved, the host controller HP sets the initial values of the feature point for judgement and correlation degree threshold in step S205.

Then, in step S206, the host controller HP detects the position of the mark as the target MA' by template matching in accordance with the position detection method of the abovementioned position detection apparatus 10. Subsequently, if no parameter has been saved yet (NO in step S207), the host controller HP determines a parameter containing the feature point for judgement and correlation degree threshold in accordance with a method represented by the aforementioned first to third methods in step S208, and saves the parameter in step S209.

On the other hand, if the host controller HP determines in step S202 that this target is not the first target, the process advances to step S210, and the host controller HP sets a parameter containing the feature point for judgement and correlation degree threshold determined when the position of the first target is detected. Then, in step S211, the host controller HP detects the position of the mark as the target MA' in accordance with the set parameter.

Figure 12:
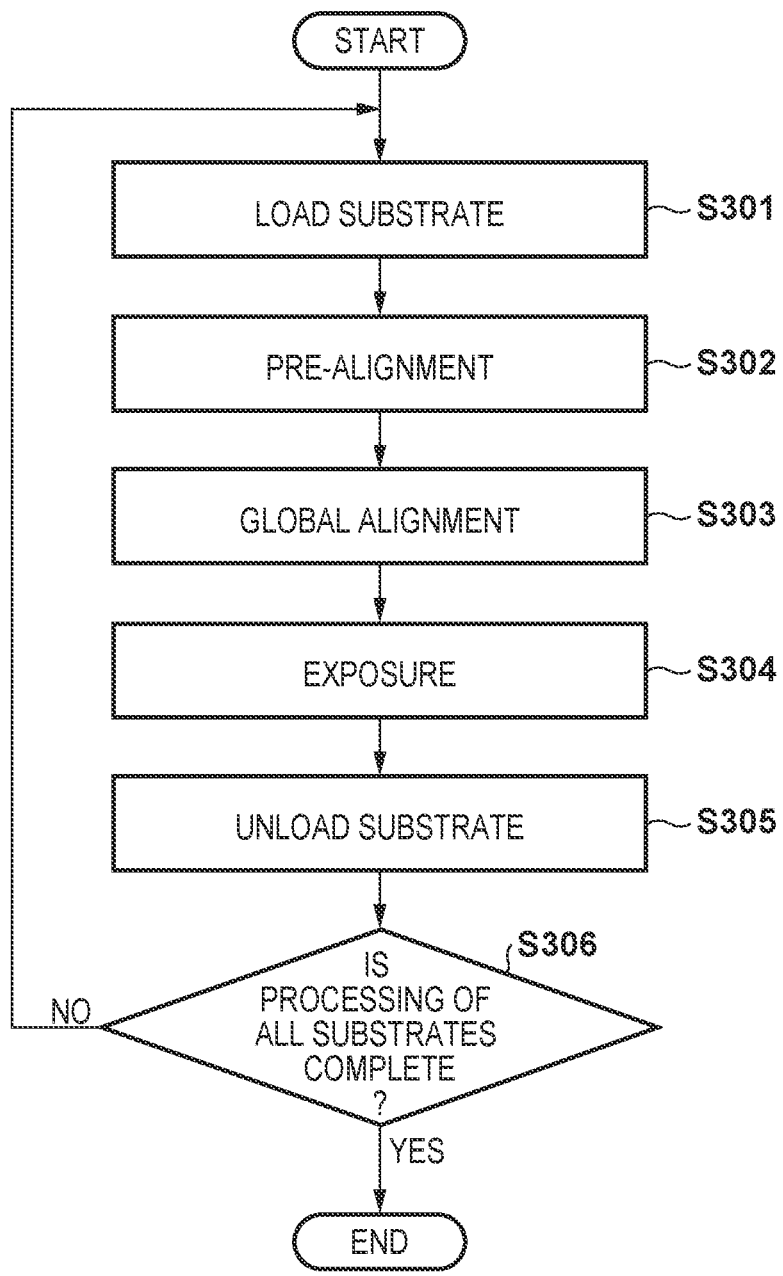
FIG. 12 is an exemplary view showing the process of an exposure job to be executed by the exposure apparatus.

The procedure of an exposure job to be executed by the exposure apparatus 100 will exemplarily be explained with reference to FIG. 12. The host controller HP controls this exposure job. In step S301, the host controller HP transfers the substrate W onto the chuck CH on the X-Y stage STG, and holds the substrate W by the chuck CH. The host controller HP performs pre-alignment of the substrate W in step S302, and then performs global alignment of the substrate W in step S303. In the pre-alignment, the host controller HP detects the positions of two alignment marks formed on the substrate W by using the alignment scope SC and alignment measurement device AC, thereby obtaining a shift, magnification, rotation, and the like of the substrate W. In the global alignment, the host controller HP detects the positions of a plurality of alignment marks on the substrate W by the alignment scope SC and alignment measurement device AC based on the results of the pre-alignment, thereby accurately obtaining the position of each shot region of the substrate W.

Subsequently, in step S304, the host controller HP exposes each shot region of the substrate W based on the results of the global alignment. After that, in step S305, the host controller HP unloads the substrate W from the chuck CH. In step S306, the host controller HP determines whether the above processing is performed on all substrates W. If there is an unprocessed substrate W, the host controller HP returns to step S301, and executes the above processing on the unprocessed substrate W.

In the abovementioned exposure apparatus 100, the processing for detecting the position of a mark on the substrate W is complete within a short time, so the throughput of the substrate exposure process improves.

An article manufacturing method of a preferred embodiment of the present invention is suitable for the manufacture of, for example, a semiconductor device and liquid crystal device, and can include a step of forming a pattern on a substrate by a lithography apparatus such as the exposure apparatus 100, and a step of processing the substrate on which the pattern is formed in the preceding step. The pattern formation step can include a step of transferring a pattern of an original plate onto a photosensitive agent, with which the substrate is coated, by using the exposure apparatus 100, and a step of developing the photosensitive agent. This article manufacturing method can further include other steps (for example, etching, resist removal, dicing, bonding, and packaging).

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s)

and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-170066, filed Aug. 31, 2016, which is hereby incorporated by reference herein in its entirety.

What is claimed is:

1. A position detection method of causing a computer to detect a position of a target in an image by template matching using a template having first to Nth feature points, where N is a natural number not less than 3, the method comprising:
obtaining an index indicating correlation between the template and the image by repeating processing for each relative position of a plurality of relative positions of the template with respect to the image, while sequentially setting first to nth feature points as a feature point of interest, where n is less than or equal to N;
determining, during obtaining of the index for each relative position of the plurality of relative positions, whether the feature point of interest is a Jth feature point, where J is a natural number not less than 2 and less than N, and where the Jth feature point is determined before causing the computer to start execution of a process of detecting the position of the target in the image;
determining, in a case where the feature point of interest is determined as the Jth feature point, whether an intermediate index indicating the correlation obtained based on processing of the first to Jth feature points satisfies a censoring condition; and
terminating processing of remaining (J+1)th to Nth feature points in a case where the intermediate index satisfies the censoring condition.

2. The method according to claim 1, wherein in the obtaining, the intermediate index is not obtained for first to (J−1)th feature points.

3. The method according to claim 1, wherein the obtaining of the index for each relative position of the plurality of relative positions includes obtaining an index value indicating the correlation for the first to Jth feature points, and obtaining the intermediate index based on the index value.

4. The method according to claim 3, wherein the obtaining of the index for each relative position of the plurality of relative positions includes:
sequentially setting the first to Jth feature points as a feature point of interest, and integrating values of a function using a value T(n) of the template at a feature point of interest as a variable; and
obtaining the intermediate index based on a value of a function using the value obtained by the integration as a variable.

5. The method according to claim 3, wherein the obtaining of the index for each relative position of the plurality of relative positions comprises:
sequentially setting the first to Jth feature points as a feature point of interest, and integrating values of a function using, as variables, a value T(n) of the template at a feature point of interest and a value of a pixel in the image, which corresponds to the feature point of interest; and
obtaining the intermediate index based on a value of a function using the value obtained by the integration as a variable.

6. The method according to claim 3, wherein the obtaining of the index for each relative position of the plurality of relative positions includes:
sequentially setting the first to Jth feature points as a feature point of interest, and performing first integration on values of a first function using a value T(n) of the template at a feature point of interest as a variable;
sequentially setting the first to Jth feature points as a feature point of interest, and performing second integration on values of a second function using a value of a pixel in the image, which corresponds to the feature point of interest, as a variable; and
obtaining the intermediate index based on the value obtained by the first integration and the value obtained by the second integration.

7. The method according to claim 1, wherein the determining of the Jth feature point includes repeating processing for each relative position of the plurality of relative positions of the template with respect to a test image by sequentially setting the first to nth feature points, where n is less than or equal to N, as a feature point of interest, thereby obtaining an index indicating correlation between the template and the test image for each of the first to nth feature points, and determining the Jth feature point based on transition of the index obtained for each of the first to nth feature points with respect to the test image.

8. The method according to claim 1, further comprising determining the censoring condition.

9. The method according to claim 8, wherein the determining of the censoring condition includes repeating processing for each relative position of the plurality of relative positions of the template with respect to a test image by sequentially setting the first to nth feature points as a feature point of interest, thereby obtaining an index indicating correlation between the template and the test image for each of the first to nth feature points, and determining the censoring condition based on transition of the index obtained for each of the first to nth feature points with respect to the test image.

10. The method according to claim 1, further comprising redefining the first to Nth feature points by rearranging the first to Nth feature points.

11. The method according to claim 1, wherein in the obtaining of the index for each relative position of the plurality of relative positions, in a case where an intermediate index obtained based on processing of first to JN2th feature points, where JN2 is a natural number larger than J, satisfies a second censoring condition, processing for (JN2+1)th and subsequent feature points is terminated.

12. A non-transitory computer readable medium storing a program for causing a computer to execute a position detection method of detecting a position of a target in an image by template matching using a template having first to Nth feature points, where N is a natural number not less than 3, the method comprising:
    obtaining an index indicating correlation between the template and the image by repeating processing for each relative position of a plurality of relative positions of the template with respect to the image, while sequentially setting first to nth feature points as a feature point of interest, where n is less than or equal to N;
    determining, during obtaining of the index for each relative position of the plurality of relative positions, whether the feature point of interest is a Jth feature point, where J is a natural number not less than 2 and less than N, and where the Jth feature point is determined before causing the computer to start execution of a process of detecting the position of the target in the image;
    determining, in a case where the feature point of interest is determined as the Jth feature point, whether an intermediate index indicating the correlation obtained based on processing of the first to Jth feature points satisfies a censoring condition; and
    terminating processing of remaining (J+1)th to Nth feature points in a case where the intermediate index satisfies the censoring condition.

13. A position detection apparatus for detecting a position of a target in an image by template matching using a template having first to Nth feature points, where N is a natural number not less than 3, the apparatus comprising a processor configured to:
    obtain an index indicating correlation between the template and the image by repeating processing for each relative position of a plurality of relative positions of the template with respect to the image, while sequentially setting first to nth feature points as a feature point of interest, where n is less than or equal to N;
    determine, during processing performed on each relative position of the plurality of relative positions to obtain the index, whether the feature point of interest is a Jth feature point, where J is a natural number not less than 2 and less than N, and where the Jth feature point is determined before causing the computer to start execution of a process of detecting the position of the target in the image;
    determine, in a case where the feature point of interest is determined as the Jth feature point, whether an intermediate index indicating the correlation obtained based on processing of the first to Jth feature points satisfies a censoring condition; and
    terminate processing of remaining (J+1)th to Nth feature points in a case where the intermediate index satisfies the censoring condition.

14. A lithography apparatus for forming a pattern on a substrate, comprising:
    an image capture configured to capture an image of a mark on the substrate;
    a positioning mechanism configured to position the substrate; and
    a controller configured to control the positioning mechanism based on the image obtained by the image capture,
    wherein the controller includes a position detection apparatus cited in claim 13 and configured to detect a position of a mark in the image obtained by the image capture.

15. The apparatus according to claim 14, wherein the position detection apparatus determines at least one of the Jth feature point and the censoring condition based on an attribute of the substrate.

16. The apparatus according to claim 14, wherein the position detection apparatus determines at least one of the Jth feature point and the censoring condition based on an image pertaining to a specific substrate.

17. An article manufacturing method comprising:
    forming a pattern on a substrate by using a lithography apparatus; and
    processing the substrate on which the pattern is formed in the forming,
    wherein an article is obtained from the processed substrate,
    wherein the lithography apparatus is configured to form a pattern on the substrate, and comprises:
        an image capture configured to capture an image of a mark on the substrate;
        a positioning mechanism configured to position the substrate; and
        a controller configured to control the positioning mechanism based on the image obtained by the image capture,
    wherein the controller includes a position detection apparatus configured to detect a position of a mark in the image obtained by the image capture,
    wherein the position detection apparatus is configured to detect a position of a target in an image by template matching using a template having first to Nth (N is a natural number not less than 3) feature points,
    the position detection apparatus comprising a processor configured to:
        obtain an index indicating correlation between the template and the image by repeating processing for each relative position of a plurality of relative positions of the template with respect to the image, while sequentially setting first to nth feature points as a feature point of interest, where n is less than or equal to N;
        determine, during processing performed on each relative position of the plurality of relative positions to obtain the index, whether the feature point of interest is a Jth feature point, where J is a natural number not less than 2 and less than N, and where the Jth feature point is determined before causing the computer to start execution of a process of detecting the position of the target in the image:
        determine, in a case where the feature point of interest is determined as the Jth feature point, whether an intermediate index indicating the correlation obtained based on processing of the first to Jth feature points satisfies a censoring condition; and
        terminate processing of remaining (J+1)th to Nth feature points in a case where the intermediate index satisfies the censoring condition.

* * * * *